(12) United States Patent
Kim et al.

(10) Patent No.: US 10,170,410 B2
(45) Date of Patent: Jan. 1, 2019

(54) SEMICONDUCTOR PACKAGE WITH CORE SUBSTRATE HAVING A THROUGH HOLE

(71) Applicant: SAMSUNG ELECTRO-MECHANICS CO., LTD., Suwon-si (KR)

(72) Inventors: Tae Hyun Kim, Suwon-si (KR); Thomas A. Kim, Suwon-si (KR); Kyu Bum Han, Suwon-si (KR); Tae Hoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/600,114

(22) Filed: May 19, 2017

(65) Prior Publication Data

US 2018/0053719 A1    Feb. 22, 2018

(30) Foreign Application Priority Data

Aug. 18, 2016  (KR) .................. 10-2016-0104868
Feb. 27, 2017  (KR) .................. 10-2017-0025309

(51) Int. Cl.
*H01L 23/12*   (2006.01)
*H01L 21/00*   (2006.01)
(Continued)

(52) U.S. Cl.
CPC ...... *H01L 23/5226* (2013.01); *H01L 23/5328* (2013.01); *H01L 23/5389* (2013.01); *H01L 23/53209* (2013.01); *H01L 23/53214* (2013.01); *H01L 23/53219* (2013.01); *H01L 23/53228* (2013.01); *H01L 23/53233* (2013.01); *H01L 23/53242* (2013.01); *H01L 23/53247* (2013.01); *H01L 23/552* (2013.01); *H01L 24/19* (2013.01); *H01L 24/20* (2013.01); *H01L 25/03* (2013.01); *H01L 25/105* (2013.01); *H01L 2224/04105* (2013.01); *H01L 2224/12105* (2013.01);
(Continued)

(58) Field of Classification Search
CPC ............... H01L 23/481; H01L 23/5226; H01L 23/53209; H01L 23/53214; H01L 23/53219; H01L 23/53228; H01L 23/53233; H01L 23/53242; H01L 23/53247; H01L 24/19; H01L 24/20; H01L 25/03

See application file for complete search history.

(56) References Cited

U.S. PATENT DOCUMENTS

2009/0321118 A1  12/2009 Kim et al.
2012/0160550 A1*  6/2012 Jeong .................. H01L 23/5389
                                                             174/257
(Continued)

FOREIGN PATENT DOCUMENTS

JP   2008-243966 A   10/2008
KR   10-2010-0000612 A   1/2010
KR   10-2014-0043568 A   4/2014

*Primary Examiner* — Alonzo Chambliss
(74) *Attorney, Agent, or Firm* — NSIP Law

(57) ABSTRACT

A semiconductor package includes a frame having a through hole, an electronic component disposed in the through hole, a metal layer disposed on either one or both of an inner surface of the frame and an upper surface of the electronic component, a redistribution portion disposed below the frame and the electronic component, and a conductive layer connected to the metal layer.

16 Claims, 10 Drawing Sheets

(51) Int. Cl.
    *H05K 7/20*           (2006.01)
    *H01L 23/522*        (2006.01)
    *H01L 23/532*        (2006.01)
    *H01L 23/538*        (2006.01)
    *H01L 23/552*        (2006.01)
    *H01L 23/00*         (2006.01)
    *H01L 25/03*         (2006.01)
    *H01L 25/10*         (2006.01)

(52) U.S. Cl.
    CPC ............... *H01L 2224/16227* (2013.01); *H01L 2225/1035* (2013.01); *H01L 2225/1058* (2013.01); *H01L 2924/1434* (2013.01); *H01L 2924/15311* (2013.01); *H01L 2924/3025* (2013.01)

(56) References Cited

U.S. PATENT DOCUMENTS

| | | | |
|---|---|---|---|
| 2013/0249101 A1* | 9/2013 | Lin | H01L 23/3121 257/773 |
| 2014/0103527 A1* | 4/2014 | Marimuthu | H01L 21/6835 257/737 |
| 2015/0021754 A1* | 1/2015 | Lin | H01L 23/5389 257/712 |
| 2016/0118325 A1* | 4/2016 | Wang | H01L 23/5389 257/774 |
| 2016/0211221 A1* | 7/2016 | Kim | H01L 23/552 |

\* cited by examiner

SEMICONDUCTOR PACKAGE WITH CORE SUBSTRATE HAVING A THROUGH HOLE

CROSS-REFERENCE TO RELATED APPLICATIONS

This application claims the benefit under 35 USC 119(a) of Korean Patent Application No. 10-2016-0104868 filed on Aug. 18, 2016 and Korean Patent Application No. 10-2017-0025309 filed on Feb. 27, 2017 in the Korean Intellectual Property Office, the entire disclosures of which are incorporated herein by reference for all purposes.

BACKGROUND

1. Field

The following description relates to a semiconductor package. The following description also relates to an electronic device module using such a semiconductor package.

2. Description of Related Art

The dissipation of heat causing power loss when electronic components are operated has become a significant issue as semiconductor packages have become slimmer, lighter, and more compact. Heat generated by electronic components causes the deterioration of electronic components and semiconductor packages, resulting in the problems of lowered reliability and degraded device characteristics.

In addition, due to the trend of miniaturization, electronic products have been reduced in size. As a result, problems in which a distance between various devices is reduced and in which the application of an electromagnetic interference (EMI) shielding method according to the related art is rendered problematic by such miniaturization, may occur.

Thus, the development of a structure in which heat dissipation and EMI shielding performance are improved would help address the above issues.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In one general aspect, a semiconductor package includes a frame comprising a through hole, an electronic component disposed in the through hole, a metal layer disposed on either one or both of an inner surface of the frame and an upper surface of the electronic component, a redistribution portion disposed below the frame and the electronic component, and a conductive layer connected to the metal layer.

The frame may include a core formed of an insulating material and a conductor layer disposed on either one or both of an upper surface and a lower surface of the core.

The conductor layer may include any one or any combination of two or more of silver (Ag), palladium (Pd), aluminum (Al), nickel (Ni), titanium (Ti), gold (Au), copper (Cu), and platinum (Pt).

The frame may include a via configured to electrically connect the conductor layer and the redistribution portion, and the via may connect the metal layer and the conductive layer to a ground electrode.

The metal layer may include a first metal layer disposed on the upper surface of the electronic component, and a second metal layer disposed on the inner surface of the frame.

The metal layer may be formed of copper (Cu), nickel (Ni), or an alloy including one of copper (Cu) or nickel (Ni).

The conductive layer may be configured to cover upper portions of the electronic component and the frame.

The conductive layer may connect the metal layer disposed on the upper surface of the electronic component and a conductor layer provided in the frame.

The conductive layer may have a strip shape.

The conductive layer may be formed of silver (Ag) epoxy, a conductive epoxy, or a solder material.

The redistribution portion may include an insulating layer formed of an insulating material, and a wiring layer provided in the insulating layer.

The insulating layer may extend to a space formed by the metal layer formed on the inner surface of the frame and the outer surface of the electronic component.

In another general aspect, a semiconductor package includes a frame including a through hole and a first metal layer disposed on an inner surface of the frame, an electronic component disposed in the through hole, a redistribution portion disposed below the frame and the electronic component, and a second metal layer configured to cover an upper surface of the electronic component and an upper surface of the frame.

The frame may include a core formed of an insulating material, and a conductor layer disposed on either one or both of an upper surface and a lower surface of the core.

The conductor layer may include any one or any combination of two or more of silver (Ag), palladium (Pd), aluminum (Al), nickel (Ni), titanium (Ti), gold (Au), copper (Cu), and platinum (Pt).

The frame may include a via configured to electrically connect the conductor layer and the redistribution portion, and the via may connect the first and second metal layers to a ground electrode.

The first and second metal layers may be formed of one of copper (Cu) or nickel (Ni), or an alloy comprising one of copper (Cu) or nickel (Ni).

The redistribution portion may include an insulating layer formed of an insulating material, and a wiring layer provided in the insulating layer, and the insulating layer may extend to a space formed by the metal layer formed on the inner surface of the frame and an outer surface of the electronic component.

In another general aspect, an electronic device module includes the first semiconductor package described above and an electronic device mounted on a surface of the semiconductor package.

In another general aspect, an electronic device module includes the first semiconductor package described above and a package-on-package mounted on a surface of the semiconductor package.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depiction of elements in the drawings may be exaggerated for clarity, illustration, and convenience.

DETAILED DESCRIPTION

Figure 1:
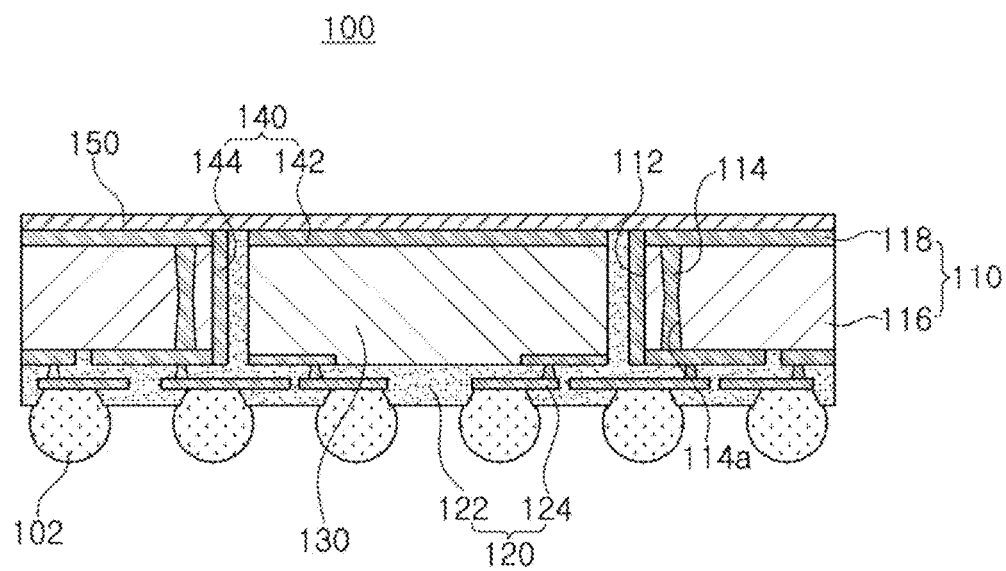
FIG. 1 is a schematic cross-sectional view of a semiconductor package according to a first example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Subsequently, examples are described in further detail with reference to the accompanying drawings.

Examples provide a semiconductor package in which heat dissipation characteristics and EMI shielding performance may be improved, and an electronic device module using such a semiconductor package.

FIG. 1 is a schematic cross-sectional view of a semiconductor package according to a first example.

With reference to the example of FIG. 1, a semiconductor package 100 according to the first example is configured to include a frame 110, a redistribution portion 120, an electronic component 130, a metal layer 140, and a conductive layer 150.

In the example of FIG. 1, the frame 110 includes a through hole 112 through which an electronic component 130 is inserted to be disposed therein. For example, the frame 110 is disposed to surround the electronic component 130. In an example, the frame 110 has a plate shape in which the electronic component 130 is disposed within the through hole 112.

In such an example, a plurality of vias 114 are formed in the frame 110. For example, the vias 114 serve to connect the conductive layer 150 and a ground electrode, to be described further below, to each other.

In the example of FIG. 1, the frame 110 includes a core 116 and conductor layers 118 formed on an upper surface and a lower surface of the core 116.

For example, the core 116 is formed of an insulating material, such as a thermosetting resin such as an epoxy resin, a thermoplastic resin such as polyimide, or a resin in which a reinforcing material such as a glass fiber or an inorganic filler is impregnated, for example, a prepreg resin, Ajinomoto Bulid-up Film (ABF) resin, FR-4 resin, Bismaleimide Triazine (BT) resin, or the like, but a material of the core 116 is not limited to these example materials and other similar materials are used in other examples. Further, in an example, in the case of the core 116, a metal having excellent rigidity and thermal conductivity is disposed in the core 116, and in this example, an iron-nickel (Fe—Ni)-based alloy is used as the metal, and copper (Cu) plating is additionally performed on a surface of the Fe—Ni-based alloy. In addition, in examples, other types of glass, ceramics, plastic materials, or the like are disposed in the core 116.

In some examples, the conductor layer 118 includes at least one or a mixture of at least two selected from the metals silver (Ag), palladium (Pd), aluminum (Al), nickel (Ni), titanium (Ti), gold (Au), copper (Cu), platinum (Pt), having excellent conductivity. However, other metals that are good conductors are also used in the conductor layer 118 in other examples. For example, the conductor layer 118 is formed using a method commonly used in the art, for example, electrolytic copper plating, electroless copper plating. However, these are only examples and other examples use other similar methods to form the conductor layer 118. In further detail, the conductor layer 118 is potentially formed using a method such as chemical vapor deposition (CVD), physical vapor deposition (PVD), sputtering, a subtractive process, an additive process, a semi-additive process (SAP), a modified semi-additive process (MSAP), or the like, but the formation method of the conductor layer 118 is not limited to these examples and other similar, appropriate methods are used in other examples.

In the example of FIG. 1, the redistribution portion 120 is formed on a lower surface of the frame 110, and the electronic component 130 is mounted on the redistribution portion 120. For example, the redistribution portion 120 includes an insulating layer 122 and a wiring layer 124. Solders 102 are formed on the wiring layer 124 that is exposed to a lower portion of the redistribution portion 120.

Additionally, in the example of FIG. 1, the wiring layer 124 of the redistribution portion 120 is electrically connected to the via 114.

In the example of FIG. 1, the insulating layer 122 of the redistribution portion 120 is also formed in a space formed between the electronic component 130 and the metal layer 140 formed on the frame 110. Thus, the electronic component 130 is affixed in place by the insulating layer 122 of the redistribution portion 120.

Accordingly, the electronic component 130 is inserted into the through hole 112 of the frame 110 to be installed on the redistribution portion 120. In an example, a connection electrode connected to the wiring layer 124 of the redistribution portion 120 is exposed on the bottom surface of the electronic component 130.

As an example, the electronic component 130 may be an integrated circuit (IC) chip, but is not limited to this type of component. For example, the electronic component 130 is alternatively provided as various other types of chips such as an image sensor, a memory chip, or another type of chip or element used in a computing environment.

In the example of FIG. 1, the metal layer 140 includes a first metal layer 142 formed on an upper surface of the electronic component 130. The first metal layer 142 is formed when the electronic component 130 is formed. Thus, the electronic component 130 on which the first metal layer 142 has been formed is provided on the redistribution portion 120. The first metal layer 142 may be formed of, for example, one of copper (Cu) or nickel (Ni), or an alloy containing either copper (Cu) or nickel (Ni). However, in other examples, other metals with similar conductive properties are used in addition to or instead of copper and nickel.

The metal layer 140 may also include a second metal layer 144 formed on an inner surface of the frame 110. The second metal layer 144 may also be formed, for example, of one of copper (Cu) or nickel (Ni), or an alloy containing either copper (Cu) or nickel (Ni), or another similar metal, as discussed above.

For example, the metal layer 140 is optionally electrically connected to a ground electrode. In other words, in such an example, the first and second metal layers 142 and 144 are electrically connected to the ground electrode.

Accordingly, because the metal layer 140 is formed on the inner surface of the frame 110, heat generated by the electronic component 130 is transferred to the redistribution portion 120 and the conductor layer 118 through the metal layer 140. As a result, heat dissipation efficiency improves.

Additionally, because the metal layer 140 is electrically connected to the ground electrode, electromagnetic interference (EMI) shielding performance also improves.

According to the example of FIG. 1, the conductive layer 150 is formed to cover an upper surface of the frame 110 and an upper surface of the electronic component 130. Thus, the conductive layer 150, formed as above, performs an EMI shielding and heat dissipation function. In other words, the conductive layer 150 serves to connect the conductor layer 118 formed on the upper surface of the frame 110 and the metal layer 140 formed on the upper surface of the electronic component 130 to each other, to perform an EMI shielding and heat dissipation function.

For example, the conductive layer 150 is formed of silver (Ag) epoxy, a conductive epoxy, or a solder material. However, according to other examples, the conductive layer 150 is formed of another, similar material with appropriate conductive properties.

Therefore, because the conductive layer 150 is formed to cover the upper surface of the frame 110 and the upper surface of the electronic component 130, EMI shielding properties improve as compared with an example in which the conductive layer 150 is not formed. For example, the EMI shielding properties improve when the conductive layer 150 is formed as compared with the case in which an EMC molding layer is formed. Furthermore, the heat dissipation performance also improves.

As described above, the EMI shielding properties and the heat dissipation performance thus improve by providing the conductive layer 150.

Subsequently, a method of manufacturing a semiconductor package according to a first example is described further with reference to the drawings.

FIGS. 2 to 9 are views illustrating processes in a method of manufacturing a semiconductor package according to the first example.

Figure 2:
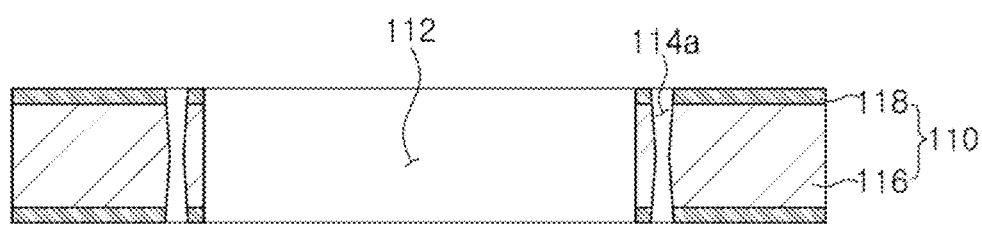
FIGS. 2 to 9 are views illustrating processes in a method of manufacturing a semiconductor package according to the first example.

First, a through hole 112 and a via hole 114a are formed in a frame 110, as illustrated in the example of FIG. 2.

Corresponding to the illustrated example of the single via hole 114a, a plurality of via holes 114a may be formed around the through hole 112.

In the example of FIG. 2, the frame 110 includes a core 116 formed of an insulating material, and conductor layers 118 formed on an upper surface and a lower surface of the core 116.

Figure 3:
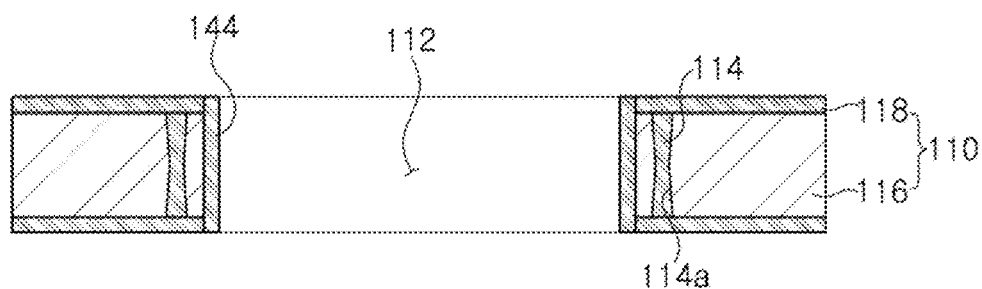

Subsequently, as illustrated in FIG. 3, a metal layer 140 is formed on an inner surface of the frame 110. The metal layer 140 may be formed of, for example, one of copper (Cu) or nickel (Ni), or an alloy containing either copper (Cu) or nickel (Ni). However, copper and nickel are only examples and other metals may be used, as appropriate.

The via hole 114a formed in the frame 110 is filled with a conductive material to form a via 114.

Figure 4:
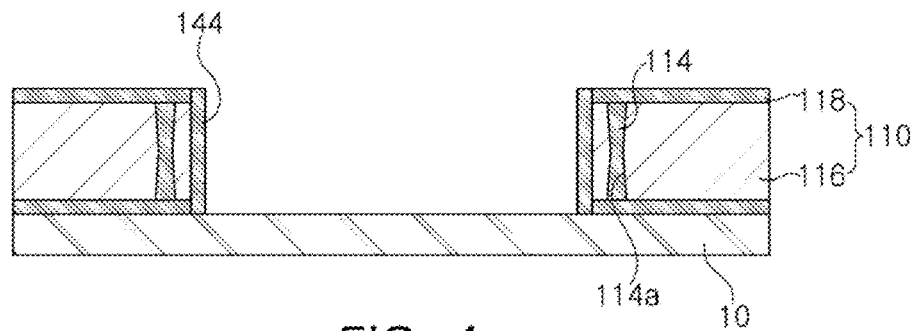

Subsequently, as illustrated in the example of FIG. 4, a first carrier 10 is attached to a lower side of the frame 110. The first carrier 10 is then removed to provide a temporary configuration for formation of the electronic component 130 and a conductive layer 150.

Figure 5:
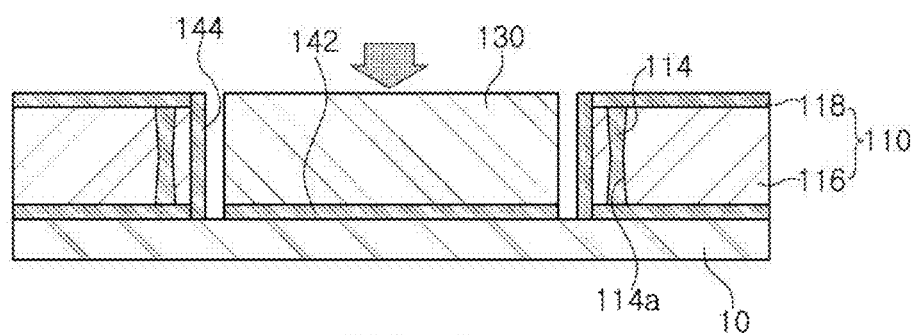

When the attachment of the first carrier 10 is complete, the electronic component 130 is attached to the first carrier 10, as illustrated in the example of FIG. 5. At this time, the electronic component 130 is disposed by insertion into the through hole 112 of the frame 110. Using such an approach, the electronic component 130 is installed on the first carrier 10 to be spaced apart from the metal layer 140 formed on the inner surface of the frame 110 by a predetermined distance.

A metal layer 140 is provided on an upper surface of the electronic component 130. The metal layer 140 formed on the upper surface of the electronic component 130 is a component formed in a process of manufacturing the electronic component 130, and is therefore formed separately from the metal layer 140 formed on the inner surface of the frame 110.

For example, the electronic component 130 on which the metal layer 140 has been formed is mounted on the first carrier 10.

However, the formation of the metal layer 140 is not limited to such an example structure, and the metal layer 140 is also optionally formed in a state in which the electronic component 130 has been mounted on the first carrier 10.

Figure 6:
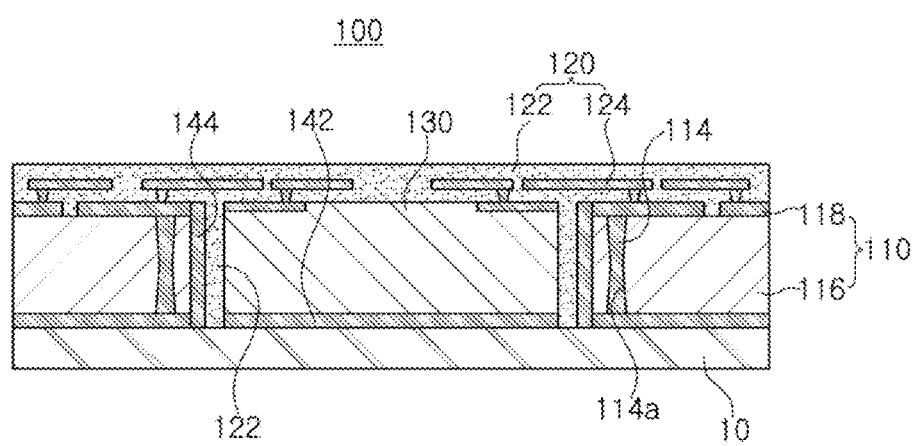

Subsequently, as illustrated in FIG. 6, a redistribution portion 120 is formed on a lower end of the frame 110. The redistribution portion 120 includes an insulating layer 122 and a wiring layer 124. The wiring layer 124 may be electrically connected to a ground electrode.

In such an example, the electronic component 130 is also electrically connected to the wiring layer 124.

The insulating layer 122 of the redistribution portion 120 is also formed in a space formed by the electronic component 130 and the metal layer 140 formed on the inner surface of the frame 110, to accordingly to serve to affix the electronic component 130.

Figure 7:
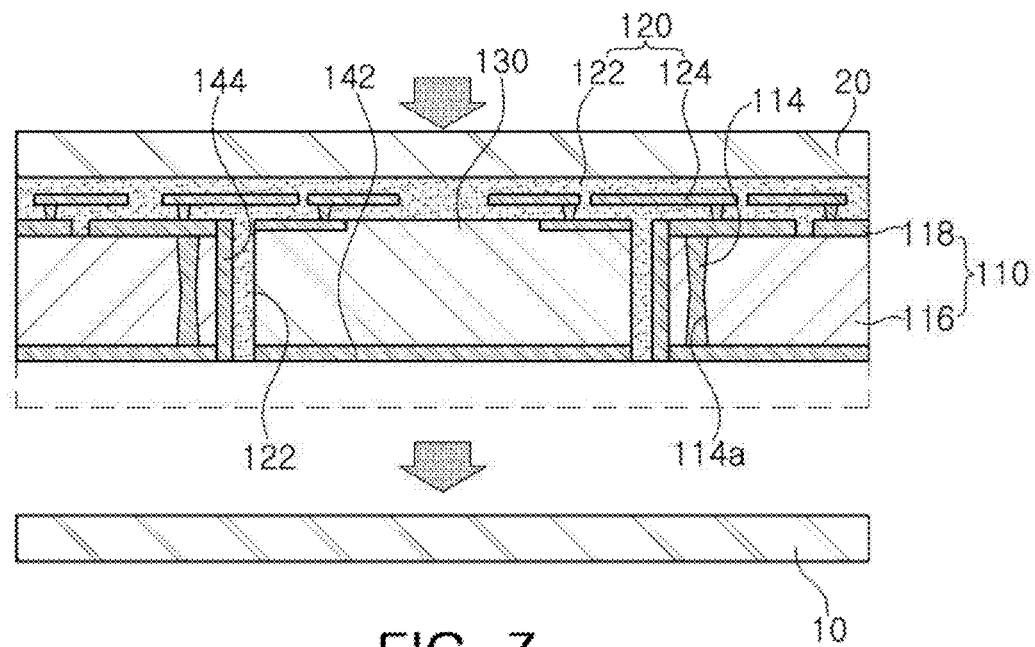

Subsequently, as illustrated in the example of FIG. 7, the first carrier 10 is removed, and a second carrier 20 is installed on a surface opposite to the surface of the frame on which the first carrier 10 has been mounted and from which it was removed.

Figure 8:
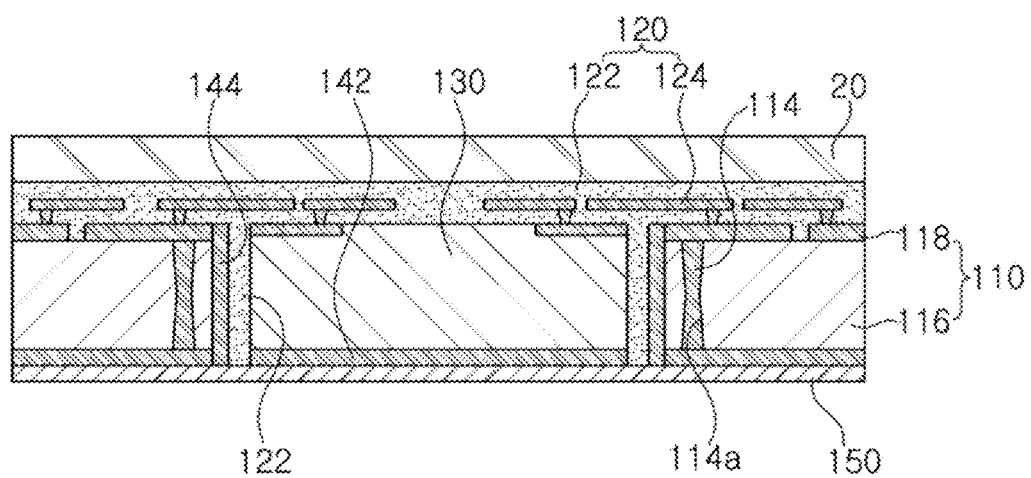

Then, as illustrated in the example of FIG. 8, the conductive layer 150 is formed. The conductive layer 150 is formed to cover the conductor layer 118 of the frame 110 and the metal layer 140 formed on the electronic component 130. The conductive layer 150 formed as above performs an EMI shielding and heat dissipation function.

In such an example, the conductive layer 150 is formed, for example, of Ag epoxy, a conductive epoxy, or a solder material, but these are only examples, and other similar materials are used for the conductive layer 150 in other examples.

Figure 9:
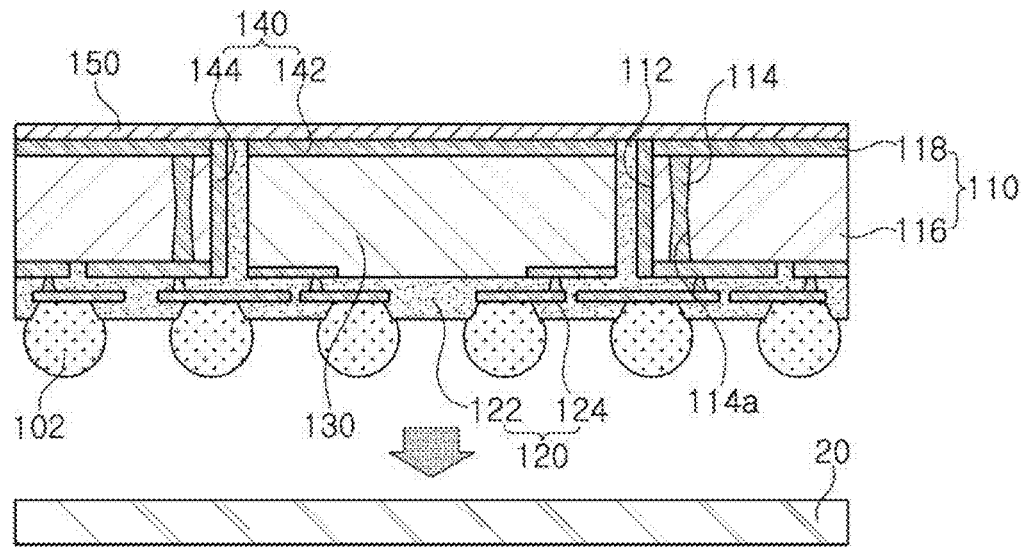

When the formation of the conductive layer 150 is completed, as illustrated in the example of FIG. 9, the second carrier 20 is removed. Then, solders 102 are formed on a lower surface of the redistribution portion 120.

As described above, EMI shielding performance and heat dissipation performance are improved by forming the conductive layer 150.

Furthermore, the electronic component 130 is affixed through using the redistribution portion 120.

Below, a semiconductor package according to a second example is described further with reference to the drawings. A description of components that are the same as those of the foregoing example described above is not provided in detail for brevity, and descriptions thereof are omitted entirely for brevity, where appropriate.

Figure 10:
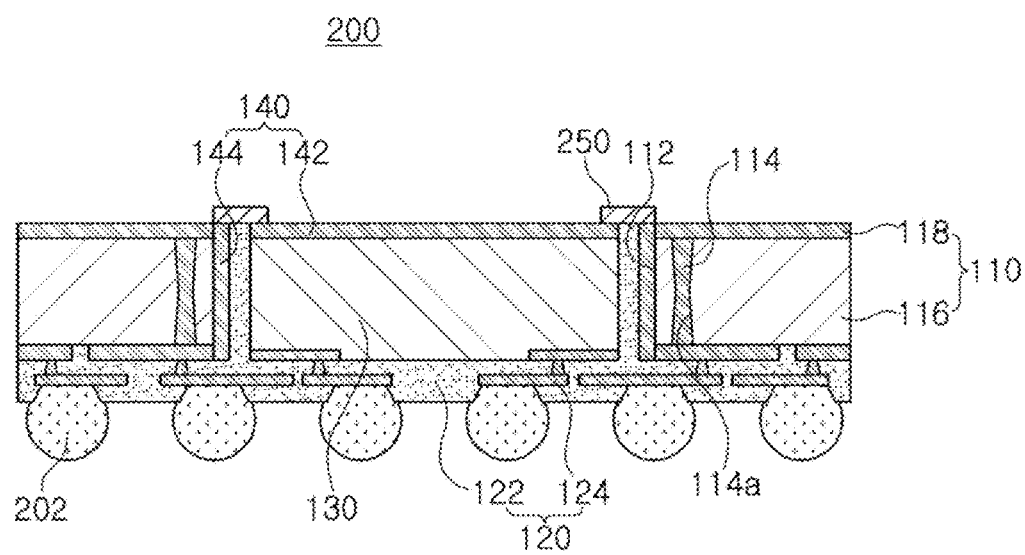
FIG. 10 is a schematic cross-sectional view of a semiconductor package according to a second example.

FIG. 10 is a schematic cross-sectional view of a semiconductor package according to a second example.

Referring to the example of FIG. 10, for example, a semiconductor package 200 according to the second example includes a frame 110, a redistribution portion 120, an electronic component 130, a metal layer 140, and a conductive layer 250.

Because the frame 110, the redistribution portion 120, the electronic component 130 and the metal layer 140 have the same configurations as those of the semiconductor package 100 according to the first example, a detailed description thereof is omitted for brevity and should be taken to correspond to the description of the semiconductor package 100.

According to the example of FIG. 10, the conductive layer 250 is formed to connect a conductor layer 118 of the frame 110 and the metal layer 140 of the electronic component 130 to each other. As an example, the conductive layer 250 has a rectangular band shape. For example, because the metal layer 140 formed on an upper surface of the electronic component 130 is ultimately connected to a ground electrode, EMI shielding performance is improved.

Furthermore, because heat generated by the electronic component 130 is transferred through the conductive layer 250, heat dissipation efficiency is improved.

The conductive layer 50 may be formed of Ag epoxy, a conductive epoxy, or a solder material, though these are only examples and other similar conductive materials are used in other examples to form the conductive layer 50.

As such, because the conductive layer 250 is formed to connect the conductor layer 118 and the metal layer 140 to each other, EMI shielding properties are improved as compared with the example in which the conductive layer 250 is not formed. In other words, compared with the example in which an EMC molding layer is formed, EMI shielding properties are improved when the conductive layer 250 is formed. Furthermore, heat dissipation performance is improved.

In addition, because the conductive layer 250 is formed to have a strip shape connecting the conductor layer 118 and the metal layer 140 to each other, manufacturing costs are reduced and a manufacturing yield is improved.

As described above, the EMI shielding properties and heat dissipation performance are improved through providing the conductive layer 250. Furthermore, the manufacturing costs are reduced and the manufacturing yield is improved.

Subsequently, a semiconductor package according to a third example is described with reference to the drawings.

Figure 11:
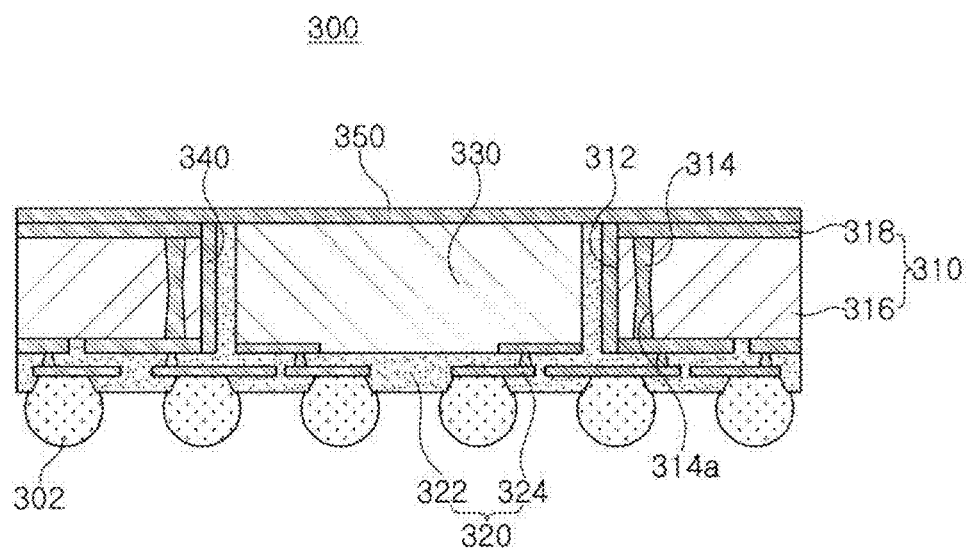
FIG. 11 is a schematic cross-sectional view of a semiconductor package according to a third example.

FIG. 11 is a schematic cross-sectional view illustrating a semiconductor package according to the third example.

Referring to the example of FIG. 11, a semiconductor package 300 according to the third example includes a frame 310, a redistribution portion 320, an electronic component 330, a first metal layer 340, and a second metal layer 350.

In the example of FIG. 11, the frame 310 includes a through hole 312 through which an electronic component 330 is inserted into to be disposed therein. For example, the frame 310 is disposed to surround the electronic component 330, and optionally has a plate shape in which the electronic component 330 is disposed inside the through hole 312, as an example.

In an example, a plurality of vias 314 are formed in the frame 310. In such an example, the vias 314 serve to connect first and second metal layers 340 and 350 and a ground electrode to be described below, to each other.

In the example of FIG. 11, the frame 310 is configured to include a core 316 and conductor layers 318 formed on an upper surface and a lower surface of the core 316.

The core 316 may be formed of an insulating material. In some examples, the core 316 a thermosetting resin such as an epoxy resin, a thermoplastic resin such as polyimide, or a resin in which a reinforcing material such as a glass fiber or an inorganic filler is impregnated, for example, a prepreg resin, Ajinomoto Bulid-up Film (ABF) resin, FR-4 resin, Bismaleimide Triazine (BT) resin, or a similar material. However, a material of the core 316 is not limited to these examples and other materials with similar properties are used to form the core 316 in other examples. Furthermore, in the example of the core 316, a metal having excellent rigidity and thermal conductivity is disposed therein, and in this case, an iron-nickel (Fe—Ni)-based alloy is used as the metal, and copper (Cu) plating is performed on a surface of the Fe—Ni-based alloy. However, these are merely example metals and other metals with similar conductive properties may be used in these roles. In addition, other glass, ceramic, plastic materials, or other similar materials are optionally present in the core.

In examples, the conductor layer 318 includes at least one or a mixture of at least two selected from silver (Ag), palladium (Pd), aluminum (Al), nickel (Ni), titanium (Ti), gold (Au), copper (Cu), platinum (Pt), having excellent conductivity, although these are only examples and other metals with similar conductive properties may be used. In such an example, the conductor layer 318 is formed using a method commonly used in the art, for example, electrolytic copper plating, electroless copper plating, although other examples are possible and other examples use other similar methods. In further detail, the conductor layer 318 may be formed using a method such as chemical vapor deposition (CVD), physical vapor deposition (PVD), sputtering, a subtractive process, an additive process, a semi-additive process (SAP), a modified semi-additive process (MSAP), or a similar method, but the formation method thereof is not limited to these examples and other appropriate formation methods are used in other examples.

The redistribution portion 320 is formed on a lower surface of the frame 310, and the electronic component 330 is mounted on an upper portion of the redistribution portion 320. For example, the redistribution portion 320 includes an insulating layer 322 and a wiring layer 324. In such an example, solders 302 are formed on the wiring layer 324 exposed to a lower portion of the redistribution portion 320.

The wiring layer 324 of the redistribution portion 320 is electrically connected to the via 314.

The insulating layer 322 of the redistribution portion 320 is formed in a space formed between the electronic component 330 and the metal layer 340 formed on the frame 310. Thus, the electronic component 330 is affixed by the insulating layer 322.

The electronic component 330 is inserted into the through hole 312 of the frame 310 to be installed on the redistribution portion 320. Also, a connection electrode connected to the wiring layer 324 of the redistribution portion 320 is exposed on a lower surface of the electronic component 330.

As an example, the electronic component 330 may be an IC chip, but the electronic component 330 is not limited to an IC chip. For example, in other examples, the electronic component 330 is changed to be replaced by other various types of chip or electronic device, such as an image sensor and a memory chip.

In the example of FIG. 11, the first metal layer 340 is formed on an inner surface of the frame 310. The first metal layer 340 is formed of, for example, one of copper (Cu) or nickel (Ni), or an alloy containing either copper (Cu) or nickel (Ni). However, these are only examples, and other materials with appropriate conductive properties are used in other examples. In addition, as an example, the metal layer 340 is electrically connected to a ground electrode.

As such, because the first metal layer 340 is formed on an inner surface of the frame 310, heat dissipation characteristics are improved. In addition, because the first metal layer 340 is connected to the ground electrode, EMI shielding performance is improved.

The second metal layer 350 is formed to cover an upper surface of the electronic component 330 and an upper surface of the frame 310. The second metal layer 350 is formed of, for example, one of copper (Cu) or nickel (Ni), or an alloy containing either copper (Cu) or nickel (Ni). However, these are only examples, and other materials with appropriate conductive properties are used in other examples. Further, the second metal layer 350 is also electrically connected to a ground electrode.

Therefore, because the second metal layer 350 is formed to cover an upper surface of the electronic component 330 and an upper surface of the frame 310, heat dissipation characteristics are improved. In addition, because the second metal layer 350 is connected to the ground electrode, EMI shielding performance is improved.

Alternatively, in an example, a metal sheet or a graphite layer is further formed on the second metal layer 350, and thus, heat dissipation characteristics are further improved.

As described above, as the first and second metal layers 340 and 350 are formed, EMI shielding performance and heat dissipation performance are improved.

Furthermore, the electronic component 330 is affixed through the redistribution portion 320.

Subsequently, a method of manufacturing a semiconductor package according to a third example is described further with reference to the drawings.

FIGS. 12 to 19 are views illustrating processes in a method of manufacturing a semiconductor package according to the third example.

Figure 12:
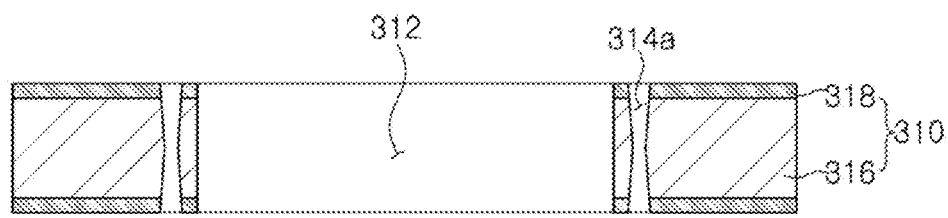
FIGS. 12 to 19 are views illustrating processes in a method of manufacturing a semiconductor package according to the third example.

First, a through hole 312 and a via hole 314a are formed in a frame 310 as illustrated in the example of FIG. 12. According to the example of the via hole 314a, a plurality of via holes 314a are formed around the through hole 312.

The frame 310 is configured to include a core 316 formed of an insulating material, and conductor layers 318 formed on an upper surface and a lower surface of the core 316.

Figure 13:
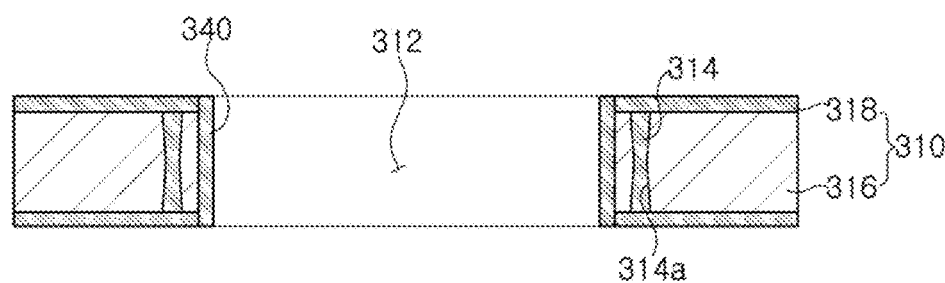

Subsequently, as illustrated in the example of FIG. 13, a first metal layer 340 is formed on an inner surface of the frame 310. The first metal layer 340 is formed of, for example, one of copper (Cu) or nickel (Ni), or an alloy containing either copper (Cu) or nickel (Ni). However, these are only examples, and other materials with appropriate conductive properties are used in other examples.

The via hole 314a formed in the frame 310 is filled with a material, such as a metal, to thereby form a via 314.

Figure 14:
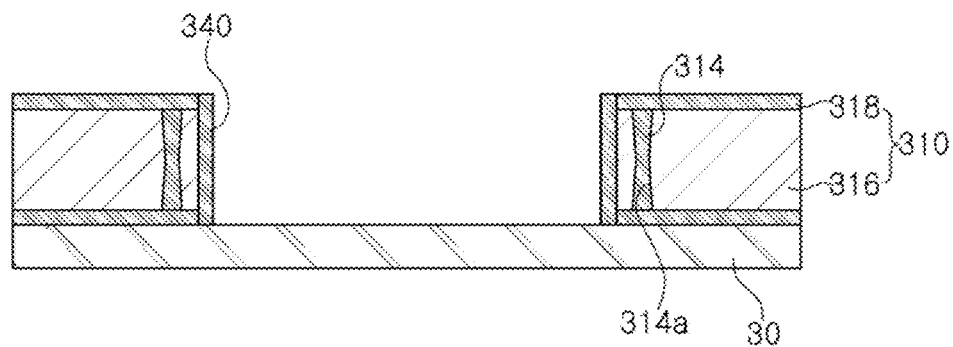

Then, as illustrated in the example of FIG. 14, a first carrier 30 is attached to a lower side of the frame 310. The first carrier 30 is a temporary configuration for installation of the electronic component 330 and the formation of the redistribution portion 320. Thus, the first carrier 30 is removed later.

Figure 15:
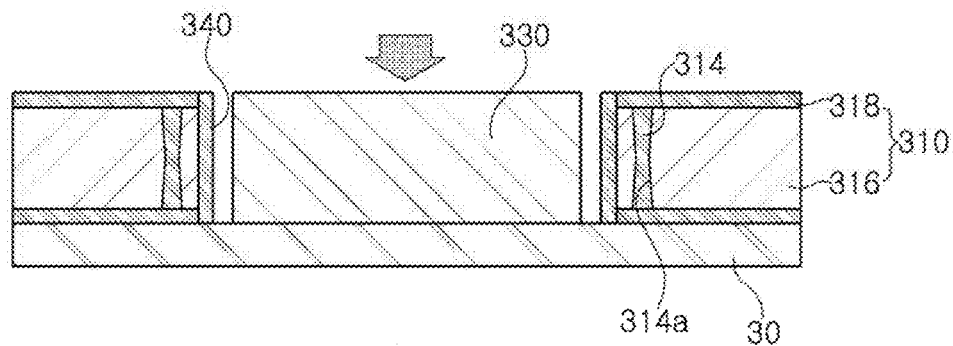

When the attachment of the first carrier 30 is complete, the electronic component 330 is attached to the first carrier 30, as illustrated in the example of FIG. 15. At this time, the electronic component 330 is inserted into the through hole 312 of the frame 310 to be disposed within. Thus, the electronic component 330 is installed on the first carrier 30 to be spaced apart from the first metal layer 340 formed on the inner surface of the frame 310 by a predetermined distance.

Figure 16:
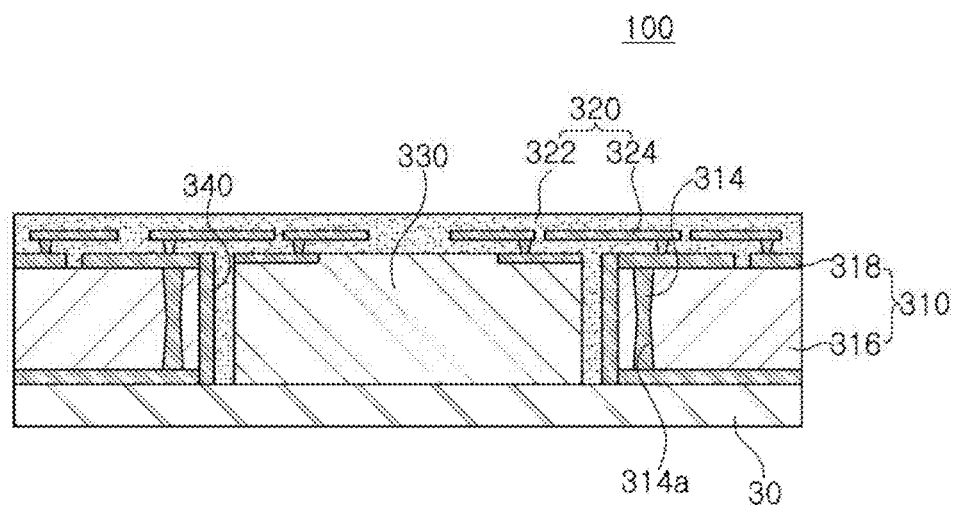

Subsequently, as illustrated in the example of FIG. 16, the redistribution portion 320 is formed on a lower end of the frame 310. For example, the redistribution portion 320 includes an insulating layer 322 and a wiring layer 324. In such an example, the electronic component 330 is electrically connected to the wiring layer 324.

For example, the insulating layer 322 of the redistribution portion 320 is formed in a space formed between the electronic component 330 and the metal layer 340 formed on the frame 310. Thus, the electronic component 330 is affixed by the insulating layer 322.

Figure 17:
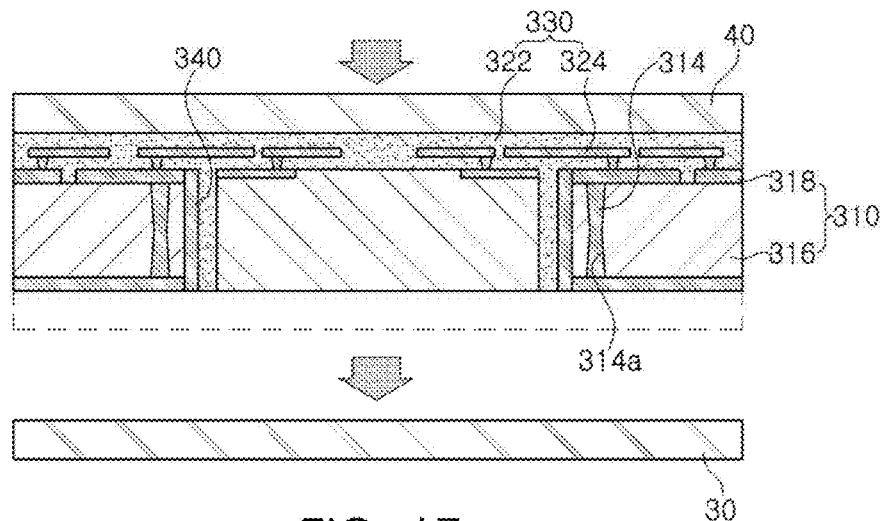

Subsequently, as illustrated in the example of FIG. 17, the first carrier 30 is removed, and a second carrier 40 is installed on a surface opposite to the surface of the frame on which the first carrier 30 has been mounted and then from which the first carrier 30 has been removed.

Figure 18:
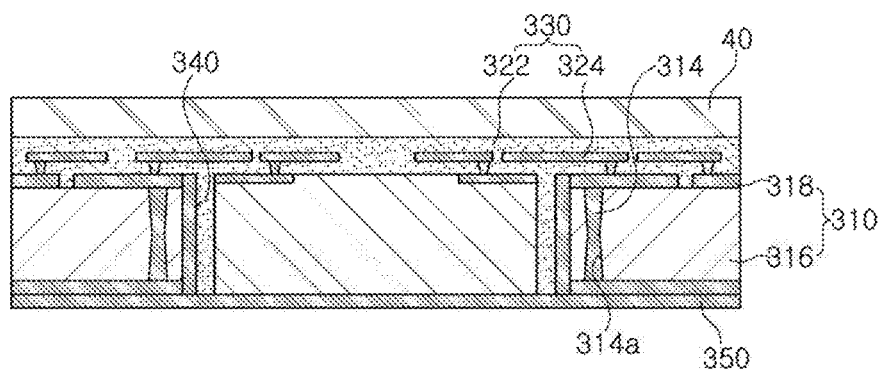

Subsequently, as illustrated in the example of FIG. 18, the second metal layer 350 is formed on an upper surface of the electronic component 330 and an upper surface of the frame 310. Although the present example illustrates that the second metal layer 350 is also formed on the conductive layer 318 formed on the frame 310 to overlap with the conductive layer 318 by way of example, an example of the present disclosure is not limited to such a configuration. For example, the second metal layer 350 is only formed on the electronic component 330 so as to be connected to the conductor layer 318 of the frame 310.

The second metal layer 350 may be formed of, for example, one of copper (Cu) or nickel (Ni), or an alloy containing either copper (Cu) or nickel (Ni). However, these are only examples, and other materials with appropriate conductive properties are used in other examples. The present example illustrates that the first metal layer 340 and the second metal layer 350 are formed of the same material by way of example. However, examples of the present disclosure are not limited to this particular example. For example, the first and second metal layers 340 and 350 are optionally formed of different materials.

Figure 19:
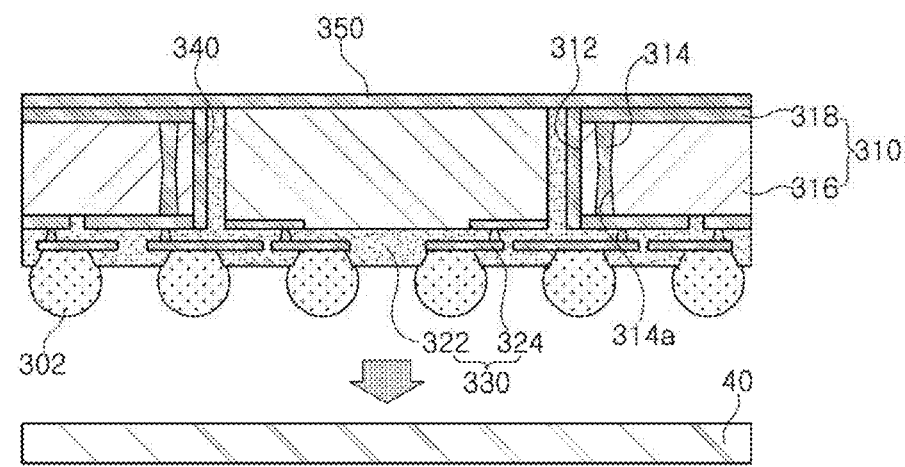

Then, as illustrated in the example of FIG. 19, the second carrier 40 is removed, and solders 302 are formed on a lower surface of the redistribution portion 320.

As described above, heat dissipation characteristics are improved via including the first and second metal layers 340 and 350, and EMI shielding performance is also improved.

Figure 20:
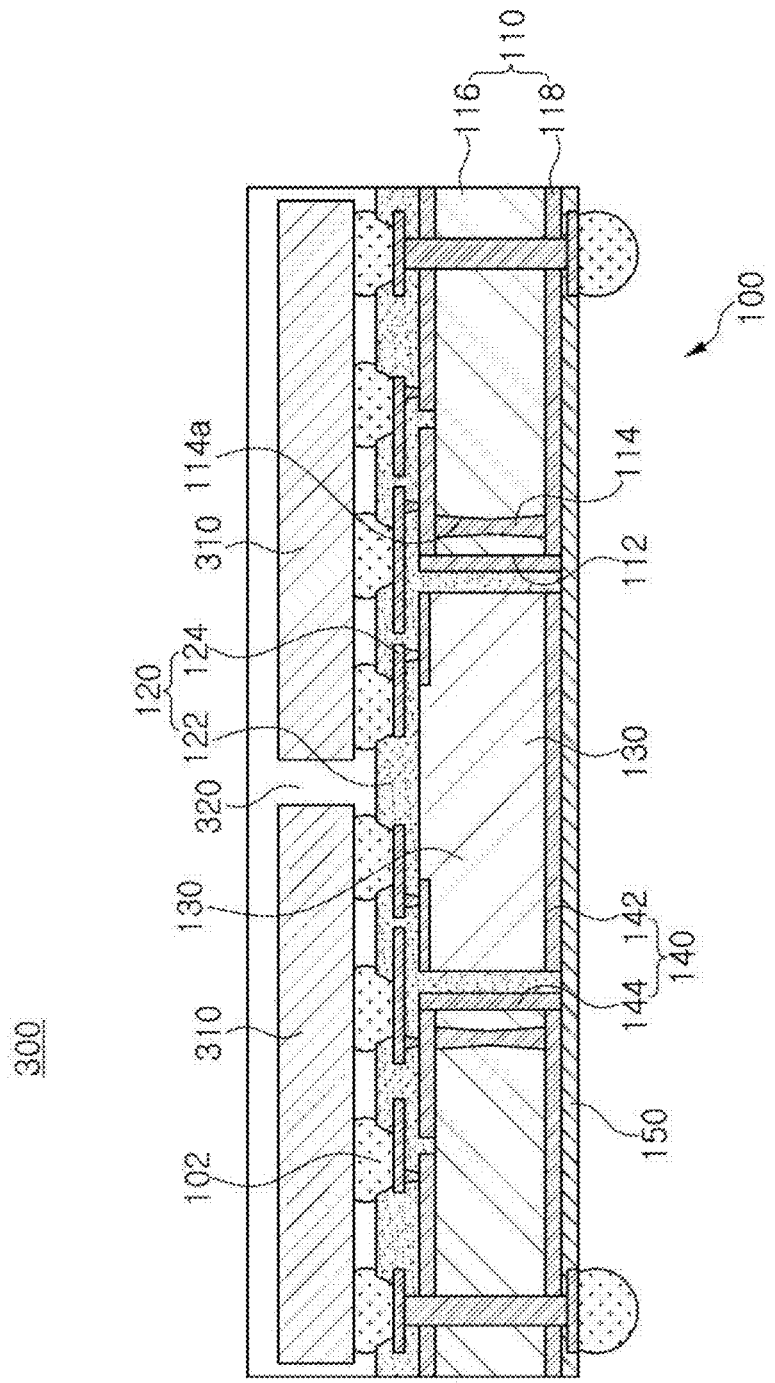
FIG. 20 is a schematic cross-sectional view of an electronic device module according to a first example.

FIG. 20 is a schematic cross-sectional view of an electronic device module according to a first example.

Referring to the example of FIG. 20, an electronic device module 300 according to the first example includes at least one electronic device 310 mounted on the semiconductor package 100 described above with reference to the example of FIG. 1. Furthermore, a sealing portion 320 is provided to seal the electronic device 310.

By contrast, the semiconductor package 100 according to the first example is provided with connection pads 402 disposed on two surfaces of the semiconductor package 100. Therefore, a main substrate is mounted on a first surface of the two surfaces of the semiconductor package 100, and the electronic device 310, manufactured separately, is mounted on a second surface of the semiconductor package 100.

As the electronic device 310, at least one of an active element and a passive element is used, and the sealing portion 320 is formed of an epoxy molding compound (EMC). However, these are only examples and other appropriate alternatives are used in other examples.

In addition, in the example of the semiconductor package 100 according to the first example, a plurality of connection pads 102 are disposed on the entirety of the first surface of the semiconductor package 100. In this example, because a relatively increased amount of electronic devices 310 is mounted in the semiconductor package 100, the degree of integration is increased.

Although the present example illustrates that the semiconductor package 100 according to the first example is used, by way of example, examples of the present disclosure are not limited thereto and other examples of the semiconductor package are used in other examples.

For example, the semiconductor package 200 according to the second example or the semiconductor package 300 according to the third example is also used in this context.

Figure 21:
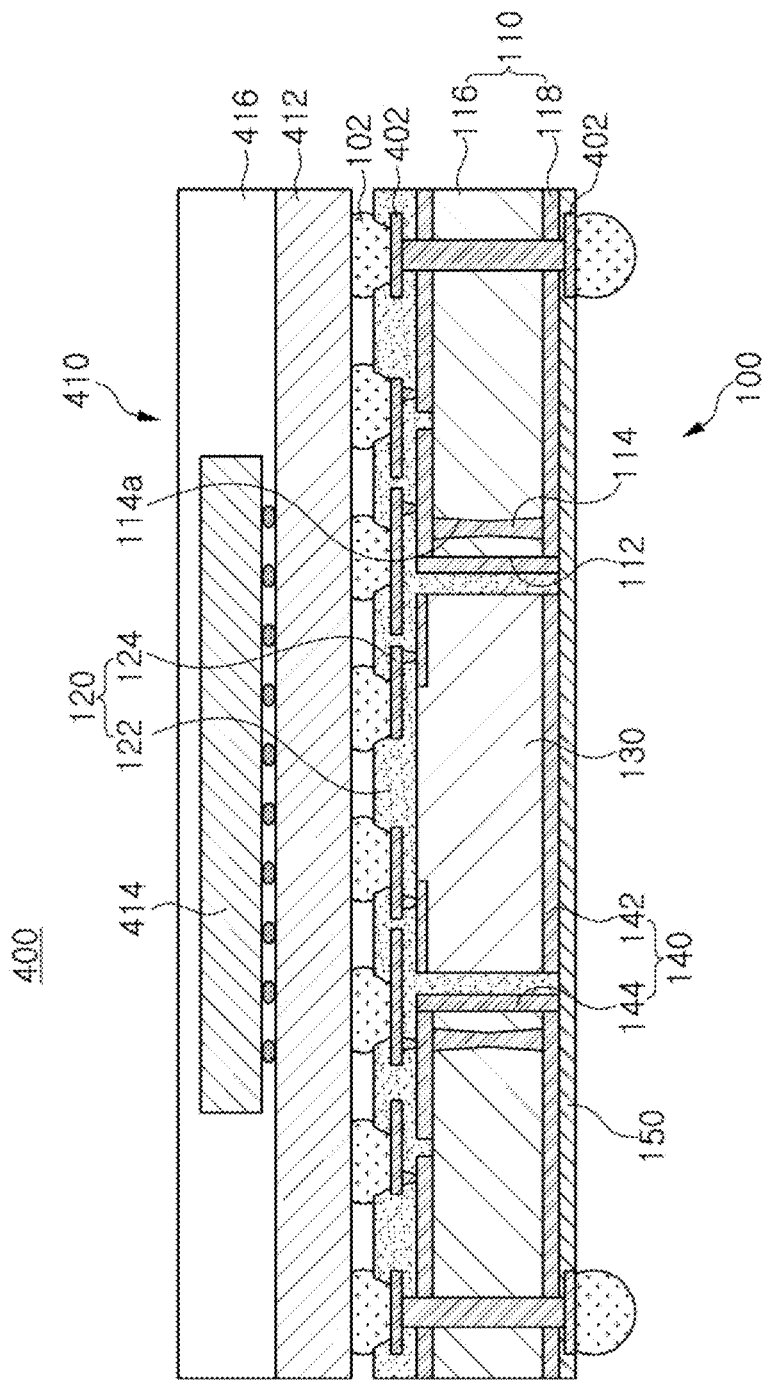
FIG. 21 is a schematic cross-sectional view of an electronic device module according to a second example.

FIG. 21 is a schematic cross-sectional view of an electronic device module according to a second example.

Referring to the example of FIG. 21, an electronic device module 400 according to the second example includes a package-on-package (PoP) 410 mounted on the semiconductor package 100 described above with reference to the example of FIG. 1.

In addition, in the example of the semiconductor package 100 according to the examples discussed above, connection pads 402 are disposed on two surfaces of the semiconductor package 100. Thus, a main substrate is mounted on a first surface of the two surfaces of the semiconductor package 100, and the package-on-package (PoP) 410 manufactured separately is mounted on a second surface of the semiconductor package 100.

As an example, the package-on-package 410 is configured in such a manner that an electronic device 414 is mounted on a package substrate 412 and the electronic device 414 is sealed by a sealing portion 416, but examples are not limited to this particular example. In an example, any components that capable of being mounted on the first surface of the semiconductor package 100, such as a heat dissipating member, are mounted on the first surface of the semiconductor package 100.

In addition, in the example of the semiconductor package 100 according to the first example, a plurality of connection pads 402 are able to be disposed on the entirety of the first surface of the semiconductor package 100. As a result, a package having a relatively large amount of input/output (I/O) terminals are able to be mounted on the first surface. Thus, reliability of bonding with the package-on-package 410 mounted on the second surface is enhanced.

Although the present example illustrates that the semiconductor package 100 according to the first example is used by way of explanation, examples of the present disclosure are not limited to this particular example and other examples of the semiconductor package are used in other examples.

For example, the semiconductor package 200 according to the second example or the semiconductor package 300 according to the third example are optionally used in other examples.

Figure 22:
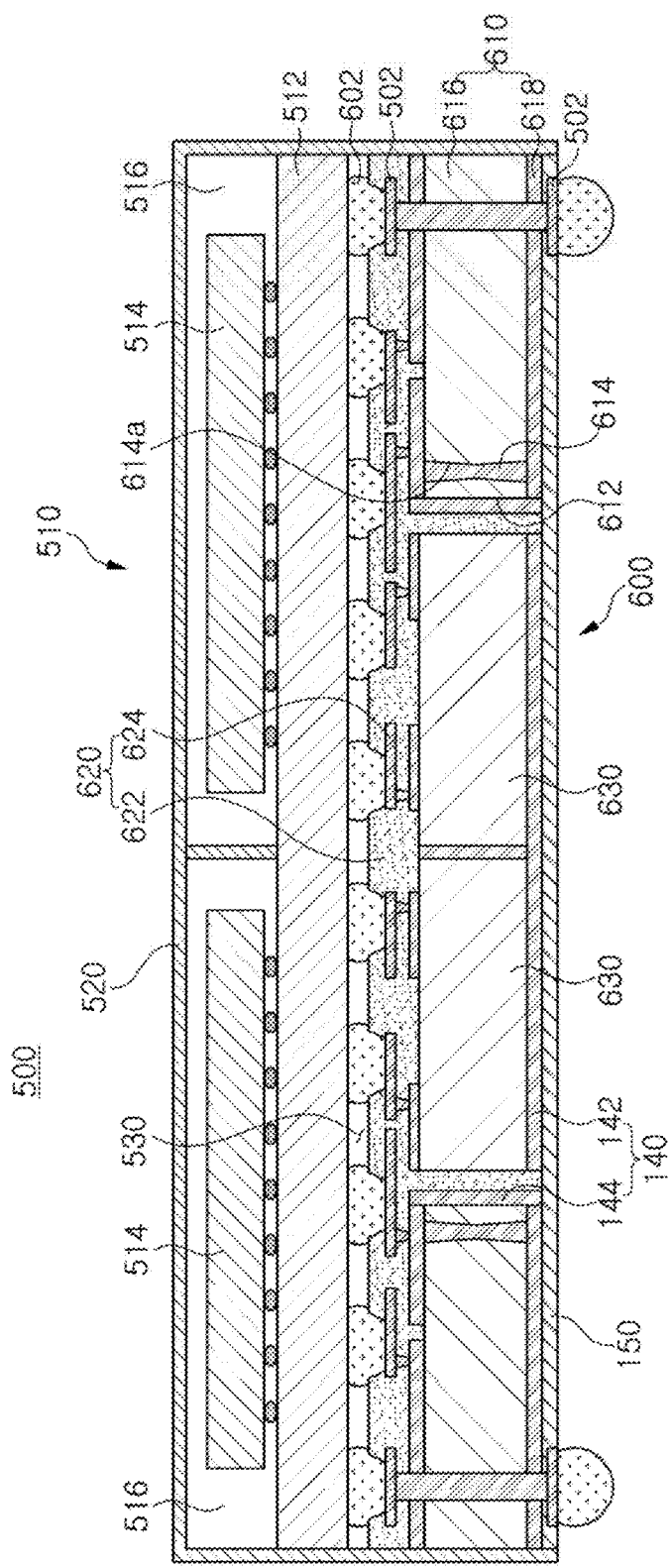
FIG. 22 is a schematic cross-sectional view of an electronic device module according to a third example.

FIG. 22 is a schematic cross-sectional view of an electronic device module according to a third example.

Referring to the example FIG. 22, an electronic device module 500 according to the third example includes a package-on-package (PoP) 510 mounted on a semiconductor package 600.

The semiconductor package 600 includes a plurality of electronic components 630 within. In this examples, examples of the electronic components 630 included in the semiconductor package 600 include a power amplifier, a filter, and an integrated circuit (IC). However, these are only examples and other examples of electronic components 630 are possible. For example, the electronic components are embedded in form of a bare die. The semiconductor package 600 has the same configuration as that of the semiconductor package 100 according to the first example, except that a plurality of the electronic components 630 are mounted, as explained above.

According to an example, the package-on-package 510 is configured in such a manner that a plurality of electronic devices 514 are mounted on a package substrate 512 and the electronic devices 514 are sealed by a sealing portion 516. However, the package-on-package 510 is not limited thereto.

Also, a cap member 520 is disposed on a surface of the electronic device module 500 according to the third example.

The cap member 520 is provided to shield electromagnetic waves. Thus, the cap member 520 is formed on a surface formed by the semiconductor package 600 and the package-on-package 510.

In this example, an insulating material 530 fills a space between the semiconductor package 600 and the package-on-package 510.

The cap member 520 is not limited to the above configuration, and in examples is only formed on a surface of the semiconductor package 600 or the package-on-package 510, as required. In addition, the cap member 520 is interposed between the electronic devices 514 provided in the package-on-package 510, to block interference between the electronic devices 514.

In the case of the electronic device module 500 according to the example described above, the electronic components 630 are embedded therein in a state of a bare die, and connection terminals 502 are disposed on two surfaces of the electronic device module. Thus, the electronic device module 500 is utilized in a package-on-package (PoP) structure while also being significantly reduced in size as a electronic device module 500.

In addition, because heat generated in an electronic device is effectively discharged through a block conductor, temperature of an electronic device module is prevented from increasing during operation of the electronic device module.

As set forth above, according to examples, heat dissipation characteristics and EMI shielding performance are improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor package, comprising:
a frame comprising a through hole;
an electronic component disposed in the through hole;
a metal layer disposed on either one or both of an inner surface of the through hole and an upper surface of the electronic component;
a redistribution portion disposed below the frame and the electronic component; and
a conductive layer electrically connected to the metal layer,
wherein the redistribution portion comprises an insulating layer formed of an insulating material, and a wiring layer provided in the insulating layer, and
wherein the insulating layer extends to a space formed by a portion of the metal layer formed on an inner surface of the frame and an outer surface of the electronic component.

2. The semiconductor package of claim 1, wherein the frame comprises a core formed of an insulating material and a conductor layer disposed on either one or both of an upper surface and a lower surface of the core.

3. The semiconductor package of claim 2, wherein the conductor layer comprises any one or any combination of two or more of silver (Ag), palladium (Pd), aluminum (Al), nickel (N), titanium (TI), gold (Au), copper (Cu), and platinum (Pt).

4. The semiconductor package of claim 2, wherein the frame comprises a via configured to electrically connect the conductor layer and the redistribution portion, and
the via connects the metal layer and the conductive layer to a ground electrode.

5. The semiconductor package of claim 1, wherein the metal layer comprises a first metal layer disposed on the upper surface of the electronic component, and a second metal layer disposed on the inner surface of the frame.

6. The semiconductor package of claim 5, wherein the metal layer is formed of copper (Cu), nickel (Ni), or an alloy comprising one of copper (Cu) or nickel (Ni).

7. The semiconductor package of claim 1, wherein the conductive layer is configured to cover upper portions of the electronic component and the frame.

8. The semiconductor package of claim 1, wherein the conductive layer connects the metal layer disposed on the upper surface of the electronic component and a conductor layer provided in the frame.

9. The semiconductor package of claim 8, wherein the conductive layer has a strip shape.

10. The semiconductor package of claim 1, wherein the conductive layer is formed of silver (Ag) epoxy, a conductive epoxy, or a solder material.

11. An electronic device module, comprising:
the semiconductor package of claim 1, and
an electronic device mounted on a surface of the semiconductor package.

12. An electronic device module, comprising:
the semiconductor package of claim 1, and
a package-on-package mounted on a surface of the semiconductor package.

13. A semiconductor package, comprising:
a frame comprising a through hole and a first metal layer disposed on an inner surface of the through hole;
an electronic component disposed in the through hole;
a redistribution portion disposed below the frame and the electronic component; and
a second metal layer configured to cover an upper surface of the electronic component and an upper surface of the frame,
wherein the frame comprises a core formed of an insulating material, and a conductor layer disposed on either one or both of an upper surface and a lower surface of the core,
wherein the redistribution portion comprises an insulating layer formed of an insulating material, and a wiring layer provided in the insulating layer, and
wherein the insulating layer extends to a space formed by a portion of the first metal layer formed on an inner surface of the frame and an outer surface of the electronic component.

14. The semiconductor package of claim 13, wherein the conductor layer comprises any one or any combination of two or more of silver (Ag), palladium (Pd), aluminum (Al), nickel (Ni), titanium (Ti), gold (Au), copper (Cu), and platinum (Pt).

15. The semiconductor package of claim 13, wherein the frame comprises a via configured to electrically connect the conductor layer and the redistribution portion, and
the via connects the first and second metal layers to a ground electrode.

16. The semiconductor package of claim 13, wherein the first and second metal layers are formed of one of copper (Cu) or nickel (Ni), or an alloy comprising one of copper (Cu) or nickel (Ni).

* * * * *